United States Patent [19]

Cordell

[11] Patent Number: 5,036,516
[45] Date of Patent: Jul. 30, 1991

[54] PROCESS AND MEANS FOR SELFTEST OF RAMS IN AN ELECTRONIC DEVICE

[76] Inventor: Steve Cordell, 3317 Cardiff Ave., Los Angeles, Calif. 90034

[21] Appl. No.: 309,138

[22] Filed: Feb. 13, 1989

[30] Foreign Application Priority Data

Feb. 20, 1988 [DE] Fed. Rep. of Germany ....... 3805391

[51] Int. Cl.$^5$ .............................................. G01F 11/00
[52] U.S. Cl. .................................................. 371/16.1
[58] Field of Search .................... 371/16.1, 21.1, 15.1; 364/200 MS File, 900 MS File; 365/201

[56] References Cited

U.S. PATENT DOCUMENTS 4,583,222 4/1986 Fossum ............................... 371/16.1
4,622,668 11/1986 Dancker ........................ 371/21.1 X Primary Examiner—Joseph Ruggiero
Assistant Examiner—Robert W. Beausoliel
Attorney, Agent, or Firm—Dickstein, Shapiro & Morin

[57] ABSTRACT

A method of self-testing RAMs in an electronic device such as a computer in which the cell or cells to be tested are determined by an analysis of the current instruction as well as by the use of instruction and address information of instructions whose future execution and operation can be reasonably predicted. The testing of the current cells under test therefore occurs on a non-interference basis and only when the CPU or the peripheral devices do not require RAM access.

16 Claims, 1 Drawing Sheet

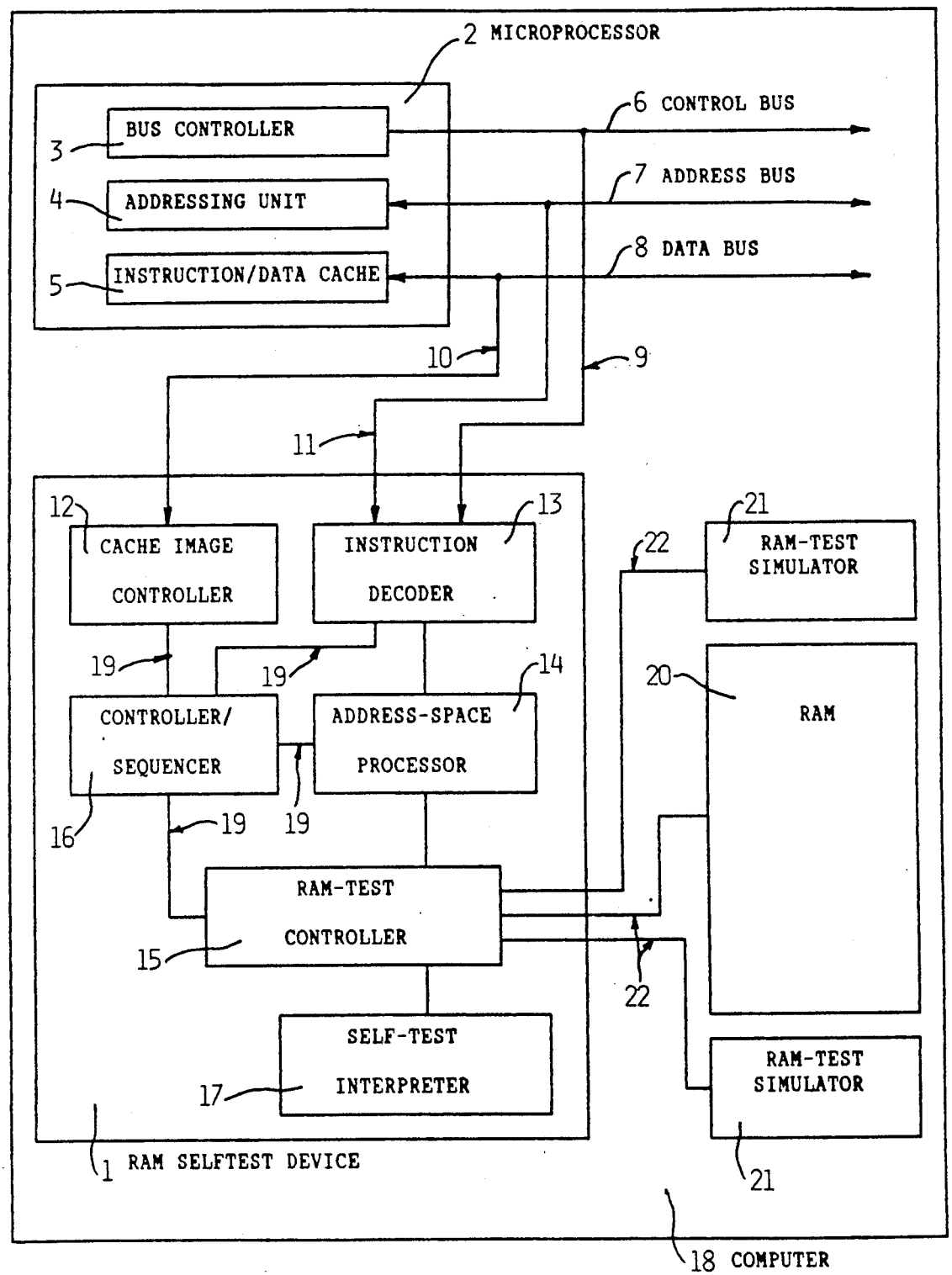

PROCESS AND MEANS FOR SELFTEST OF RAMS IN AN ELECTRONIC DEVICE

BACKGROUND

1. Field of the Invention

The present invention relates to a method and process for executing a selftest of a Random Access Memory (RAM) in an electronic device, especially a device such as a computer whose central processing unit (CPU) and arithmetic logic unit (ALU) are dependent on a stored program.

2. Background of the Prior Art

During the operation of a computer in flight critical or safety critical applications, only certain types of RAM fault modes can be selftested, and this testing is further limited as follows: When a cell or a small group of cells is tested consecutively, each access to these cells must be prohibited during the test, and interrupts to the CPU may be prohibited in order to decrease the total testing time; the shorter these prohibitions, the smaller the number of cells which can be tested during each test cycle and the longer the complete RAM test cycle. In actual practice, the test time as well as the interrupt inhibit time is arbitrarily limited to the number of cycles in which two 16-bit words, or with the most modern 32-bit microprocessors two 32-bit words can be tested. The realtime is calculated from the number of instructions based essentially on their execution times: two each Save, Store, Read, Restore instructions. Whether the crosstalk between neighboring cells can be tested during this short time depends on the RAM-architecture. In no case can a von Neumann programmed computer read cells which are not consecutively addressed quickly enough to either test the above mentioned crosstalk (because of the above mentioned access and interrupt inhibit) or to test the recovery times of the read amplifiers of the RAMs. To test the latter, consecutive cells must be read out with the maximum readout speed of the RAMs. By reading out the cells at the maximum speed via a von Neumann programmed computer, boundary conditions cannot be detected and random faults are not reliably detectable.

A critical RAM test is only possible by use of special test devices (testers), which can exercise read and write accesses at the maximum speed of the RAM. Integrated circuits have been introduced to the market lately which can overcome certain RAM faults via fault detection and correction facilities. This facility is only active when a RAM cell is accessed, and for an avionic computer requires a significant amount of extra fault detection and correction bits (e.g. according to the method of R. Hamming). The rapid selftests of the present invention would be unnecessary, since the fault statistics can be accumulated in the computer via software; these fault-statistics programs must be called after each fault occurence and this process could hinder the main program execution.

SUMMARY AND OBJECTS OF THE INVENTION

It is therefore an object of this invention to provide a process and means for RAM selftesting while eliminating every possible inhibition to the computer central processing unit and its peripheral devices from accessing the RAM, and to very significantly increase the speed of selftesting of RAMs in electronic devices.

A further object of the invention is to eliminate the need for extra parity and fault detection and correction bits in the memory and to eliminate the need for the associated detection and correction logic.

Yet another object of the invention is to provide extra RAM self-tests for RAMs in an electronic device which at the present state of the art are only possible via special testers but which are not possible via a von Neumann programmed computer, i.e. the recovery times of the RAM read amplifiers, and the crosstalk between cells in physical proximity but which are not consecutively addressable cells of a RAM memory.

The foregoing objects are achieved by the present invention, which provides that the choice of the group of those RAM memory cells to be selftested be dependent on the current program-instruction to be executed as well as on the predictable future execution obtainable from the instruction and addressing information of the stored program, and that these RAM areas, which at the appropriate time will not be accessed by the CPU or its peripheral devices, will be selftested. The advantage of this method is the possibility of testing each and every RAM cell unimpeded by and between intended accesses of the CPU or other peripheral devices, because the RAM testing device has full knowledge of the access-intentions of the controlling devices and their peripherals. The testing runs as it were parallel to the CPU, which need not share its access time and therefore retains its full computational performance.

Further, the present invention achieves the foregoing objects by interpretation of the current program instruction and those immediatly following as well as the address and data information from the program and the CPU, and the use of this interpreted information as addressregion information for use in RAM testing. The advantage is an execution of the RAM selftest without impairing the execution of the program, since no extra program execution time is necessary.

Further, the present invention achieves the foregoing objects by comparing the address of the next to-be-tested RAM cell or cell-group with the known and predicted address information from the CPU in order to predict whether, during the RAM test for this group, one or more of the cells would be accessed. The advantage of this method is the possibility of making a variety of RAM tests: If the prediction shows that the CPU will only require a small number of access cycles to the RAM cells under test, the selftest can be delayed; otherwise another group of cells can be tested, or another type of test for these cells can be executed in order to eliminate access conflict with the CPU.

Further, the present invention achieves the foregoing objects by executing the RAM selftest according to a pre-programmed scheme on specific cells with the maximun speed of the RAM, if according to the access prediction, the cells under test will not be accessed. The advantage of the method is the possibility to execute selftests which cannot be executed by the CPU of a von Neumann programmed computer.

Further, the present invention achieves the foregoing objects by resetting the cell or cells under test to their original state with the maximum RAM speed in case an access conflict arises which was not predicted. The advantage of this method is the limitation of RAM access conflict cycles to an absolute minimum in case of a rare conflict, as the number of cells under test is intentionally kept small.

Further, the present invention achieves the foregoing objects by using an address decoder and an instruction decoder as well as an address-space processor, which are controlled by a controller, and by passing the address-space information via these said elements further to a RAM selftest controller/sequencer, which then checks the known or predicted RAM addresses with the planned cells-under-test addresses. The advantage of this method is that the same address, instruction and data information which is available to the CPU is also abailable to the RAM selftest device, which processes the information independently without disturbing the CPU execution, and which performs RAM selftests which are either impossible or pointless for a CPU to perform in a von Neumann programmed computer.

BRIEF DESCRIPTION OF THE DRAWING

FIG. 1 is an example of the RAM selftest device showing the connection between the device and the CPU and other peripheral devices via the control, address and data buses. In this example, a typical general purpose computer employing a microprocessor is used to elaborate the process and means of the present invention.

DETAILED DESCRIPTION

In FIG. 1, a possible realization of the process and means of the invention is represented. In a computer 18, the selftest device 1 of the invention has three information connections to the CPU of a microprocessor 2; the connection between the instruction-cache 5 and the cache-image controller 12 via the data bus 8, the connection between the CPU addressing unit 4 and the instruction-decoder 13 via the address bus 7, and the connection between the bus controller 3 and the instruction-controller 13 via the control bus 6.

A controller/sequencer 16 controls the devices 12 through 15 of the RAM selftest device 1 via the control connection 19. The address and instruction information from the microprocessor 2 are transformed in the cache-image controller 12 and in the instruction-decoder 13, and transmitted to the address-space processor 14, which computes the valid as well as invalid address areas and transmits this information further to the RAM-test controller 15.

Via the connections 22, test data is sent to and received from the RAM 20 as well as the RAM-test simulators 21. Said RAM-test simulators are shown as the extreme RAM cells; they may be, however, part of the RAM selftest device 1. Fault analysis information is transmitted from the RAM-test controller 15 to the selftest interpreter 17. The connection between said selftest interpreter and the microprocessor CPU is not shown; possible fault information would be transmitted via this connection.

Referring to FIG. 1, the function of the RAM selftest device 1 can be described. Said device is connected to the CPU of the microprocessor 2 and is likewise connected to the RAM 20 of the computer 18. The device has access to the busses 6, 7 and 8 and therefore at any time has the following information, partly via reverse-assembling of the program codes to be executed and partly from information to be found in the RAM 20: contents of the address register of the CPU, stack base and pointer registers, contents of the cache (if available and enabled), and supplementary addressing information from the program code including the base register of the variables and the manner of indirect and indexed addressing to be used in the instruction execution. The RAM selftest device 1 operates independently, but is sychronized with the clock which clocks the CPU. The device receives instruction information from the connecting lines 9–11, interprets the instructions and their addressing destinations by use of the above mentioned register, pointer and addressing information, and calculates whether there is danger of a RAM access conflict. This danger exists when the program instructions will perform a RAM access, or the destination in RAM is exactly that cell group which the device 1 intends to test during its next test cycle. If such a conflict is certain or if a conflict danger exists, the RAM test will not be further executed until the danger no longer exists. If the RAM and chosen address space are free to be tested, then the next cell group will be tested. If the address-space processor 14 now determines that an access conflict is possible within the next cycle, the saved information will be immediately restored in the RAM and the selftest will be suspended for a pre-programmed number of cycles. If, however, the test may run to completion, the stored test patterns will be read out of RAM without RAM wait-cycles in order to test the read amplifiers, and then the saved information will be restored in the RAM. In this manner, each cell group will be tested.

In order to supervise the functionality of the complete RAM selftest device 1, test patterns will be periodically sent to, and read from, the RAM-test simulator 21. These elements are so constructed that a fault report will be generated only when no fault exists.

Although the selftest device 1 of the present invention must be created from inte rated circuitry and is thus an extra component in any electronic device such as a computer system, RAM selftesting possibilities which were heretofore impossible without special testers are satisfied by using the teachings of this invention. In particular, by using the minimal extra circuitry of the present invention, the RAM selftesting capabilities and fault coverage approach those of special RAM testers operating as state machines. No von Neumann programmed computer has had this capability heretofore.

While this invention has been described with reference to a computer employing a common type of microprocessor which is currently available for purchase on the market, its use is not limited to microprocessors, and in future applications the availability of less information from the CPU will not hamper its utility, while a computer with more information available to the selftest device will enhance its speed and testing capabilities.

What is claimed is:

1. A method for executing a selftest of a Random Access Memory (RAM) in an electronic device, testing at the maximum speed of the RAM, especially in a device such as a computer whose central processing unit and arithmetic logic unit are dependent on a stored program, comprising the steps of:

choosing cells or cell groups of said RAM for testing, said choice depending on the current program instruction not accessing said cell or cell groups, as well as by using the instruction and address information of instructions whose future execution and RAM processing can reasonably be predicted, and performing the selftest by using said prediction to select for self-testing those cells or cell groups which will not be accessed by the central processing unit or any of its peripheral devices while said selftest on said cells or cell groups is in progress.

2. The method as specified in claim 1, wherein said current program instruction to be executed and those instructions immediately following, as well as their address and data information derived from said instructions, is interpreted used as RAM address area information for the RAM selftest.

3. The method as specified in claim 1, wherein said RAM address area information is compared with said program instruction and central processing unit information in order to predict whether, during the RAM selftest, said central processing unit or any of its said peripheral devices will require access to the RAM cell or cells to be self-tested.

4. The method as specified in claim 1, wherein a RAM selftest of said cells or cell groups is executed according to a pre-programmed scheme, whenever said cells or cell groups will not be accessed in accordance with said step of choosing said cells or cell groups for testing.

5. The method as specified in claim 1, wherein a RAM selftest of said cells or cell groups will be restored to its original contents, if any of the cells of said cell group will be accessed by the central processing unit or said peripheral devices due to an unforeseen program branch or other condition.

6. An apparatus for performing a RAM selftest as specified in claim 1, comprising an address decoder and an instruction decoder as well as an address-space processor, said decoders and processor being controlled by a controller/sequencer, and said elements controlling, computing and transmitting address-area information further to a RAM-test controller which controls the selftest of a RAM cell or cell groups currently under test.

7. The method as specified in claim 2, wherein said RAM address area information is compared with said program instruction and central processing unit information in order to predict whether, during the RAM selftest, said central processing unit or any of its said peripheral devices will require access to the RAM cell or cells to be self-tested.

8. The method as specified in claim 2, wherein a RAM selftest of said cells or cell groups is executed according to a pre-programmed scheme, whenever said cells or cell groups will not be accessed in accordance with said step of choosing said cells or cell groups for testing.

9. The method as specified in claim 3, wherein a RAM selftest of said cells or cell groups is executed according to a pre-programmed scheme, whenever said cells or cell groups will not be accessed in accordance with said step of choosing said cells or cell groups for testing.

10. The method as specified in claim 2, wherein a RAM selftest of said cells or cell groups in progress will be terminated and every cell of the cell group will be restored to its original contents, if any of the cells of said cell group will be accessed by the central processing unit or said peripheral devices due to an unforeseen program branch or other condition.

11. The method as specified in claim 3, wherein a RAM selftest of said cells or cell groups in progress will be terminated and every cell of the cell group will be restored to its original contents, if any of the cells of said cell group will be accessed by the central processing unit or said peripheral devices due to an unforeseen program branch or other condition.

12. The method as specified in claim 4, wherein a RAM selftest of said cells or cell groups in progress will be terminated and every cell of the cell group will be restored to its original contents, if any of the cells of said cell group will be accessed by the central processing unit or said peripheral devices due to an unforeseen program branch or other condition.

13. An apparatus for performing a RAM selftest as specified in claim 2, comprising an address decoder and an instruction decoder as well as an address-space processor, said decoders and processor being controlled by a controller/sequencer, and said elements controlling, computing and transmitting address-area information further to a RAM-test controller which controls the selftest of a RAM cell or cell groups currently under test.

14. An apparatus for performing a RAM selftest as specified in claim 3, comprising an address decoder and an instruction decoder as well as an address-space processor, said decoders and processor being controlled by a controller/sequencer, and said elements controlling, computing and transmitting address-area information further to a RAM-test controller which controls the selftest of a RAM cell or cell groups currently under test.

15. An apparatus for performing a RAM selftest as specified in claim 4, comprising an address decoder and an instruction decoder as well as an address-space processor, said decoders and processor being controlled by a controller/sequencer, and said elements controlling, computing and transmitting address-area information further to a RAM-test controller which controls the selftest of a RAM cell or cell groups currently under test.

16. An apparatus for performing a RAM selftest as specified in claim 5, comprising an address decoder and an instruction decoder as well as an address-space processor, said decoders and processor being controlled by a controller/sequencer, and said elements controlling, computing and transmitting address-area information further to a RAM-test controller which controls the selftest of a RAM cell or cell groups currently under test.

* * * * *